(12) United States Patent
Kim

(10) Patent No.: US 7,268,534 B2
(45) Date of Patent: Sep. 11, 2007

(54) SORTING HANDLER FOR BURN-IN TESTER

(75) Inventor: Seong Bong Kim, Chonan-si (KR)

(73) Assignee: Mirae Corporation, Chonan-si (KR)

(*) Notice: Subject to any disclaimer, the term of this patent is extended or adjusted under 35 U.S.C. 154(b) by 0 days.

(21) Appl. No.: 11/098,536

(22) Filed: Apr. 5, 2005

(65) Prior Publication Data
US 2005/0168214 A1 Aug. 4, 2005

Related U.S. Application Data

(63) Continuation of application No. 10/753,432, filed on Jan. 9, 2004, now Pat. No. 6,882,141.

(30) Foreign Application Priority Data

Sep. 18, 2003 (KR) ............................. 2003-64836

(51) Int. Cl.
G01R 31/28 (2006.01)

(52) U.S. Cl. ................................................. 324/158.1

(58) Field of Classification Search ................ 324/765, 324/755, 760, 158.1; 414/274, 282, 403; 209/574
See application file for complete search history.

(56) References Cited

U.S. PATENT DOCUMENTS

| 5,307,011 | A  | * | 4/1994 | Tani .......................... 324/158.1 |
| 5,621,312 | A  |   | 4/1997 | Achor et al. |
| 5,635,832 | A  | * | 6/1997 | Ito et al. .................... 324/158.1 |
| 6,184,675 | B1 | * | 2/2001 | Bannai ...................... 324/158.1 |
| 6,259,247 | B1 | * | 7/2001 | Bannai ...................... 324/158.1 |
| 6,406,246 | B1 | * | 6/2002 | Itoh et al. .................... 414/274 |
| 6,563,331 | B1 | * | 5/2003 | Maeng ......................... 324/760 |

* cited by examiner

Primary Examiner—Ha Tran Nguyen
Assistant Examiner—Tung X. Nguyen
(74) Attorney, Agent, or Firm—Ked & Associates, LLP

(57) ABSTRACT

Sorting handler for a burn-in tester including two DC testing parts and two unloading buffers on opposite sides of a burn-in board at a working post in a line with a main working line respectively, one pair of a loader part for supplying new devices and an unloader part for receiving tested good devices on each of side parts of a body, so that two insert/remove pickers carry out a work continuously in which two insert/remove pickers move along the main working line in both directions with reference to the burn-in board, to remove the devices from the burn-in board, and insert devices to be tested in the space in turn, thereby improving a test productivity per a unit time period.

12 Claims, 3 Drawing Sheets

US 7,268,534 B2

SORTING HANDLER FOR BURN-IN TESTER

This application is a continuation of U.S. application Ser. No. 10/753,432, which was filed on Jan. 9, 2004, and which now has issued as U.S. Pat. No. 6,882,141.

This application claims the benefit of the Korean Application No. P2003-0064836 filed on Sep. 18, 2003, which is hereby incorporated by reference.

BACKGROUND OF THE INVENTION

1. Field of the Invention

The present invention relates to sorting handlers for testing electric characteristics of a device, such as a semiconductor device of which production is finished, and more particularly, to a sorting handler for a burn-in tester for carrying out a burn-in test that is a heat resistance test carried out before shipment of the device to minimize occurrence of defect at the device caused by heat generated during use of the device applied to a product.

2. Background of the Related Art

In general, devices, such as semiconductor devices, are assured of product reliability by testing various electric performances of finished devices at a tester, and only shipping good products as a result of the test.

For minimizing occurrence of the defect due to heat under an actual environment of use, the burn-in test is carried out as one of device tests. The sorting handler for a burn-in tester is an apparatus for carrying out a series of works of unloading the device tested at the burn-in tester from a test board, sorting at shipment trays according to a result of the test, and loading new devices to be tested on the test board, automatically.

The Korean Laid Open Patent No. 2000-0065749 (Published on Nov. 15, 2000) which is applied, and registered by the applicant discloses a sorting handler for a burn-in tester which enables size and system of the apparatus compact, makes exchange of trays at a sorting part easier, and shortens a test time period.

FIG. 1 illustrates a diagram of the sorting handler for a burn-in tester schematically, provided with a loader part 3 in one side part of a body 1 having trays mounted thereon for receiving devices to be tested newly, an unloader part 4 opposite to the loader part 3 having trays mounted thereon for receiving good devices as a result of the burn-in test, and a sorting part 5 between the loader part 3 and a front part of the unloader part 4 having trays mounted thereon for receiving defective, or re-test devices as the result of the burn-in test.

There are a rack 2 on one side of the body 1 for supplying burn-in boards 'B' having burn-in tested devices loaded thereon, and an X-Y-θ table under the body 1 for drawing the burn-in board 'B' from the rack 2, introducing the burn-in board 'B' to an inner side of the body 1, returning the burn-in board 'B' to an original position of the rack 2, and moving the burn-in board in an X or a Y direction by one step at a working position.

There are a DC testing part 8 at a side of the loader part 3, an unloading buffer 10 at one side of the unloader part 4, and a working space between the DC testing part 8 and the unloading buffer 10 where the burn-in board 'B' is positioned.

There is an X-axis main shaft 6 crossing the body 1 over the DC testing part 8, the burn-in board 'B', and the unloading buffer 20, having a loading picker 11 for transferring the devices from the loader part 3 to the DC testing part 8, an insert picker 12 and a remove picker 13 for transferring the devices from the DC testing part 8 to the burn-in board 'B', and from the burn-in board 'B' to the unloading buffer 10, and an unloading picker 14 for transferring the devices from the unloading buffer 10 to the unloader part 4. The insert picker 12 and the remove picker 13 are coupled to a slider (not shown) moving along the X-axis main shaft 6, to moving along the X-axis main shaft 6 together.

There is a sorting picker 15 arranged over the sorting part 5 to move along sorting X-, and Y-axis shafts 7 for transferring defective devices from the DC testing part 8 and the unloading buffer 10 to the sorting part 5.

There is a tray transfer 18 arranged in a rear part of the loader part 3 and the unloader part 4 to move along a tray transfer X-axis shaft 19 for transferring empty trays having all devices loaded on the loader part 3 to the unloader part 4.

The operation of the related art sorting handler for a burn-in tester will be described.

When a worker loads burn-in tested burn-in boards on the rack, and puts the handler into operation, the X-Y-θ table 20 moves toward the rack 2, draws one of the burn-in boards 'B' from the rack 2, moves to the central working space of the body 1, and turns the burn-in board at 90°.

Then, the tray 'T' at the loader part 3 moves backward to a position under the X-axis main shaft 6, and the loading picker 11 holds the device at the loader part 3, and moves to the DC testing part 8. A simple DC test is carried out at the DC testing part 8, when the loading picker 11 moves to the loader part 3 again, and holds the next device for transferring to the DC testing part 8.

When the DC test is finished at the DC testing part 8, both the insert picker 12 and the remove picker 13 respectively move to positions over the DC testing part 8 and the burn-in boards 'B' at the same time. Then, the insert picker 12 holds the device at the DC test part 8, and the remove picker 13 holds the burn-in tested device on the burn-in board 'B' of the remove picker 13.

Both the insert picker 12 and the remove picker 13 move to left when the drawing is seen from above, load the devices on the burn-in board 'B' and the unloading buffer 10, and move to the DC testing part 8 and the burn-in board 'B', again, respectively.

Then, the unloading picker 14 transfers the burn-in tested good devices on the unloading buffer 10 to the tray 'T' on the unloader part 4. If there is any defective device on the unloading buffer 10, the sorting picker 15 moves to the unloading buffer 10 along the sorting X-, and Y-axis shafts 7, holds the defective device, and loads on the tray 'T' on the sorting part 5.

If all the burn-in tested devices are removed from the burn-in board 'B', and new devices are stuffed thereon, the X-Y-θ table 20 transfers the burn-in board 'B' to an original position of the rack 2.

In the meantime, the related art sorting handler for a burn-in tester has a drawback in that, after the insert picker 12 and the remove picker 13 transfer the devices from the DC testing part 8 and the burn-in board 'B' to the burn-in board and the unloading buffer 10, the insert picker 12 and the remove picker 13 return to the positions of the DC testing part 8 and the burn-in board 'B' again, with empty handed, i.e., without any real work, that makes both working efficiency, and test productivity per unit time period (UPH=units per hour) poor.

The unidirectional work flow of the related art sorting handler for a burn-in tester, in which only device loading is made in one side part of the handler body, and only device unloading is made in the other side part of the handler body, results in a poor work efficiency.

To cope with this drawback, the applicant discloses a sorting handler for a burn-in tester in the Korean Laid Open Patent No. 2000-0067665 (Laid Open on Nov. 25, 2000) suggesting two DC testing parts and the buffers arranged in symmetry with reference to burn-in board to progress device loading/unloading in both side parts of the body simultaneously, for reducing a testing time period, and improving working efficiency.

However, the foregoing sorting handler for a burn-in tester has a drawback in that the working time period can be reduced and the working efficiency can be improved only when one kind of work is selected, and carried out at the both side parts simultaneously during the device loading and unloading.

In other words, the working efficiency can be improved by using the both side parts as the loader parts, or the unloader parts when the sorting handler for a burn-in tester carries out loading work only in which a new device is loaded on the burn-in board, or unloading work only in which the device is transferred from the burn-in board to the tray.

However, since it is impossible that the pickers pick up a device from the burn-in board and putting a new device to be tested on the space at the same time while the pickers move along the X-axis main shaft over both side parts of the burn-in board, such a work can not but be unidirectional, that results in a poor testing work efficiency.

SUMMARY OF THE INVENTION

Accordingly, the present invention is directed to a sorting handler for a burn-in tester that substantially obviates one or more of the problems due to limitations and disadvantages of the related art.

An object of the present invention is to provide a sorting handler for a burn-in tester, which enables to eliminate a loose working time period of the pickers, for improving a testing productivity per a unit time period (UPH).

Additional features and advantages of the invention will be set forth in the description which follows, and in part will be apparent to those having ordinary skill in the art upon examination of the following or may be learned from practice of the invention. The objectives and other advantages of the invention will be realized and attained by the structure particularly pointed out in the written description and claims hereof as well as the appended drawings.

To achieve these objects and other advantages and in accordance with the purpose of the present invention, as embodied and broadly described herein, the sorting handler for a burn-in tester includes a burn-in board loading part for loading a plurality of burn-in boards each for loading devices to be burn-in tested thereon, a first loader part in one side part of the body for transferring trays on a first loading stacker, having devices to be tested newly loaded thereon, to a first loading position in succession, a first unloader part arranged on one side of, and parallel to the first loader part for transferring empty trays to an unloading position on a side of the first loading position in succession, to receive, and loading good burn-in tested devices on a first unloading stacker, a second loader part opposite to, and spaced a distance away from the first loader part and the first unloader part for transferring trays having devices to be tested newly placed thereon from a second loading stacker to a second loading position in a line with, and opposite to the first loading position in succession, a second unloader part on one side of, and parallel to the second loader part for transferring empty trays to a second unloading position on a side of the second loading position in succession, to receive, and loading good burn-in tested devices on a second unloading stacker, a sorting part for stacking trays having defective devices loaded thereon, a working post in a line with, and between the first loading and unloading position, and the second loading and unloading position, for placing the burn-in board transferred from the burn-in board loading part, a burn-in board transfer table under the body, for moving the burn-in board in an X-, Y-, or θ direction under the working post, a first DC testing part in a line with, and between the working post and the first loading, and unloading position for carrying out DC test of the devices from the first loader part, a first buffer part on one side of the first DC testing part for placing tested devices from the burn-in board, or new devices from the first loader part thereon, a second DC testing part in a line with, and between the working post and the second loading, and unloading position for carrying out DC test of the devices from the second loader part, a second buffer part on one side of the second DC testing part for placing tested devices from the burn-in board, or new devices from the second loader part thereon, an X-axis main shaft over, and across the first loading, unloading position, the working post, and the second loading and unloading position, a first loading/unloading picker movable along the X-axis main shaft, for transferring the devices from the trays at the first loading position to the DC testing part, and loading the devices on the first DC testing part, and transferring the devices from the first buffer part to the trays at the first unloading position and loading the device on the first unloading position, a second loading/unloading picker movable along the X-axis main shaft, for transferring the devices from the trays at the second loading position to the second DC testing part, and loading the devices on the first DC testing part, and transferring the devices from the second buffer part to the trays at the second unloading position and loading the device on the second unloading position, a first insert/remove picker movable along the X-axis main shaft between the first, and second loading/unloading pickers, for transferring devices between the burn-in board at the working post, and the first DC testing part and the first buffer part, a second insert/remove picker movable along the X-axis main shaft between the first, and second loading/unloading pickers, for transferring devices between the burn-in board, and the second DC testing part and the second buffer part, and a sorting picker for transferring devices other than good devices from the first, and second DC testing parts and the first, and second buffer parts to the sorting part.

It is to be understood that both the foregoing description and the following detailed description of the present invention are exemplary and explanatory and are intended to provide further explanation of the invention claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENT

Figure 1:
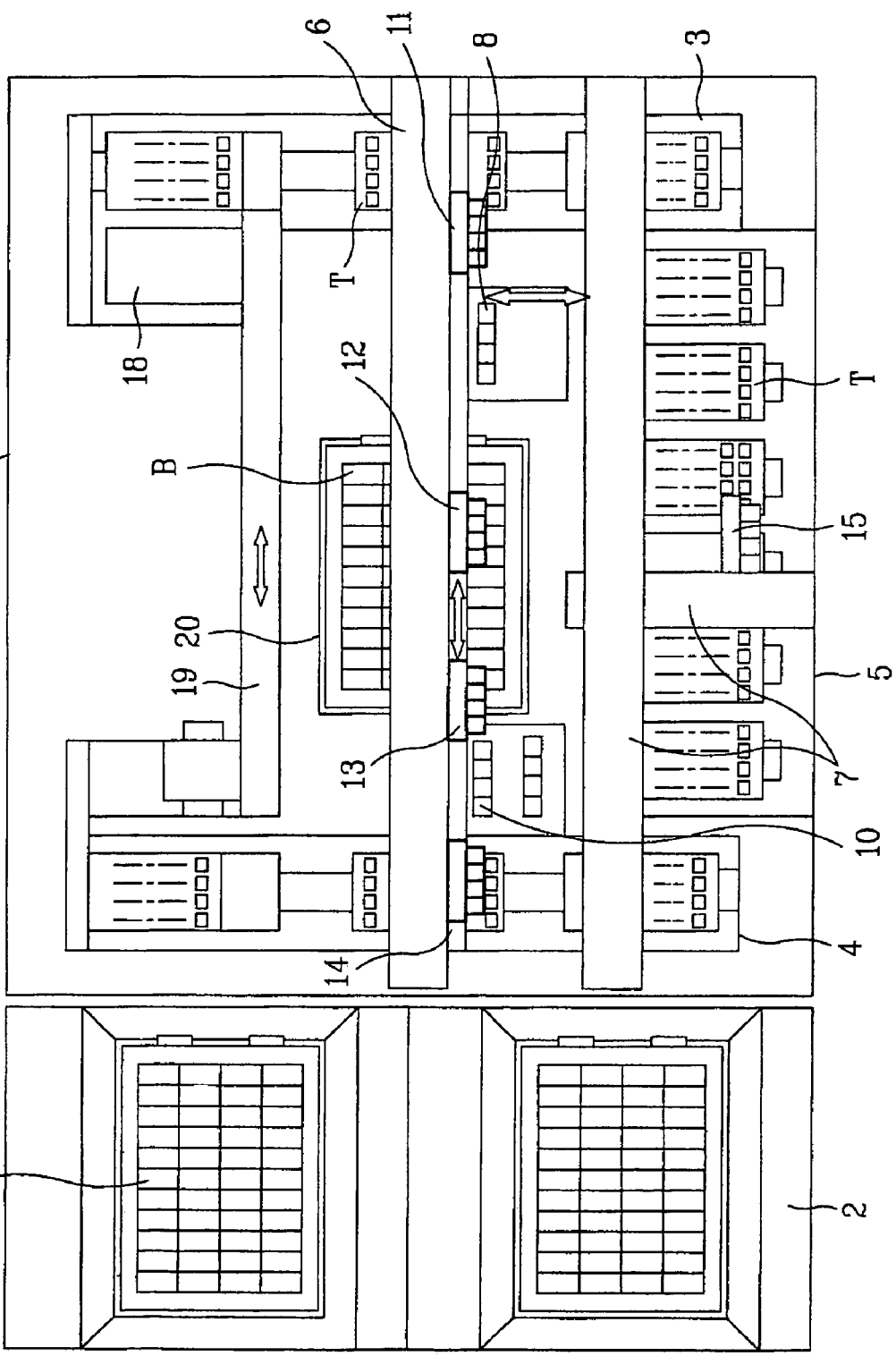
FIG. 1 illustrates a plan view of a related art sorting handler for a burn-in tester, schematically.
Figure 2:
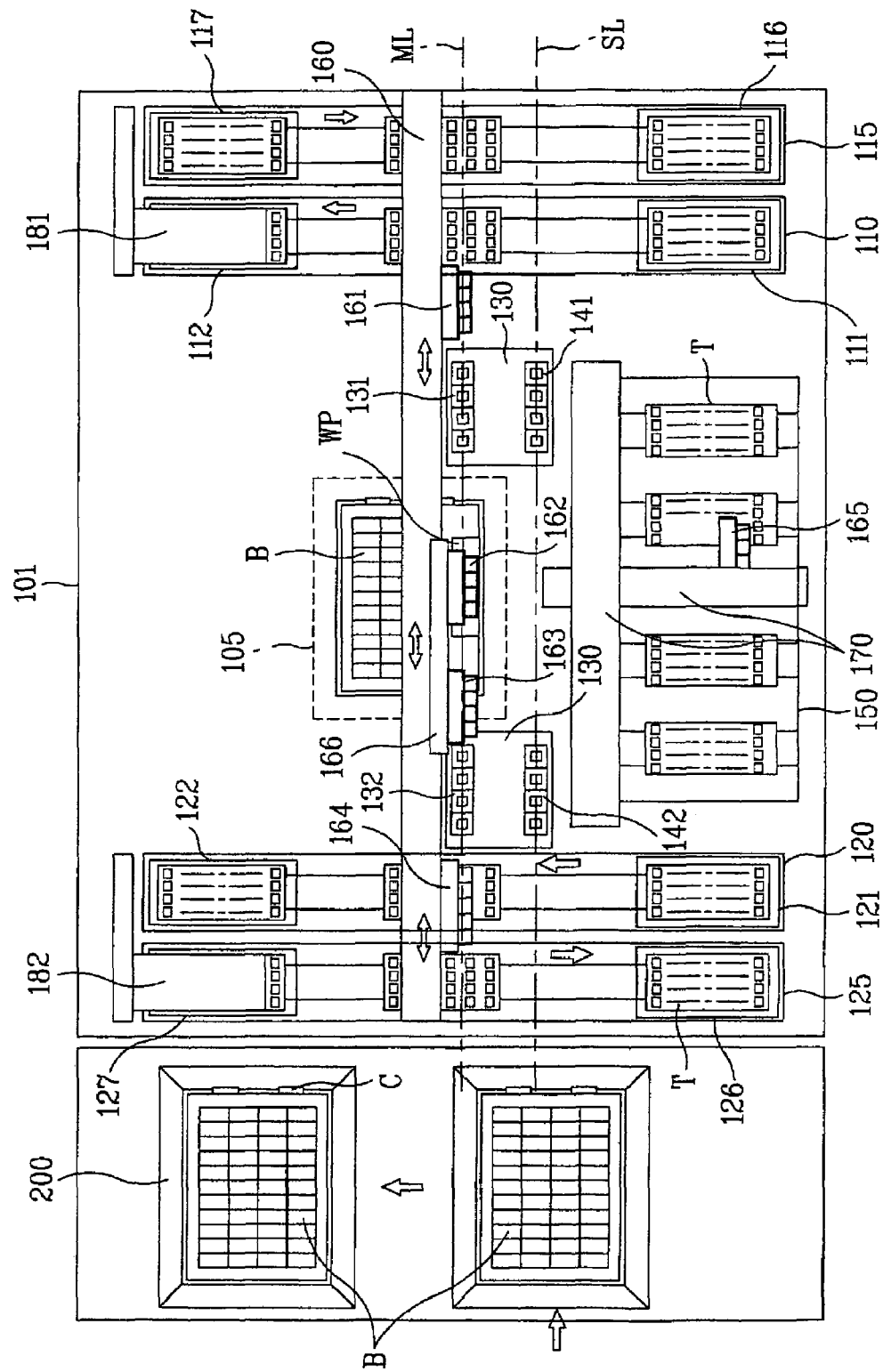
FIG. 2 illustrates a plan view of a sorting handler for a burn-in tester in accordance with a preferred embodiment of the present invention, schematically.

Reference will now be made in detail to the preferred embodiments of the present invention, examples of which are illustrated in the accompanying drawings. FIG. 2 illustrates a plan view of a sorting handler for a burn-in tester in accordance with a preferred embodiment of the present invention schematically, and FIG. 3 illustrates a perspective view of the DC testing part and the unloading buffer of the sorting handler for a burn-in tester in FIG. 2.

Figure 3:
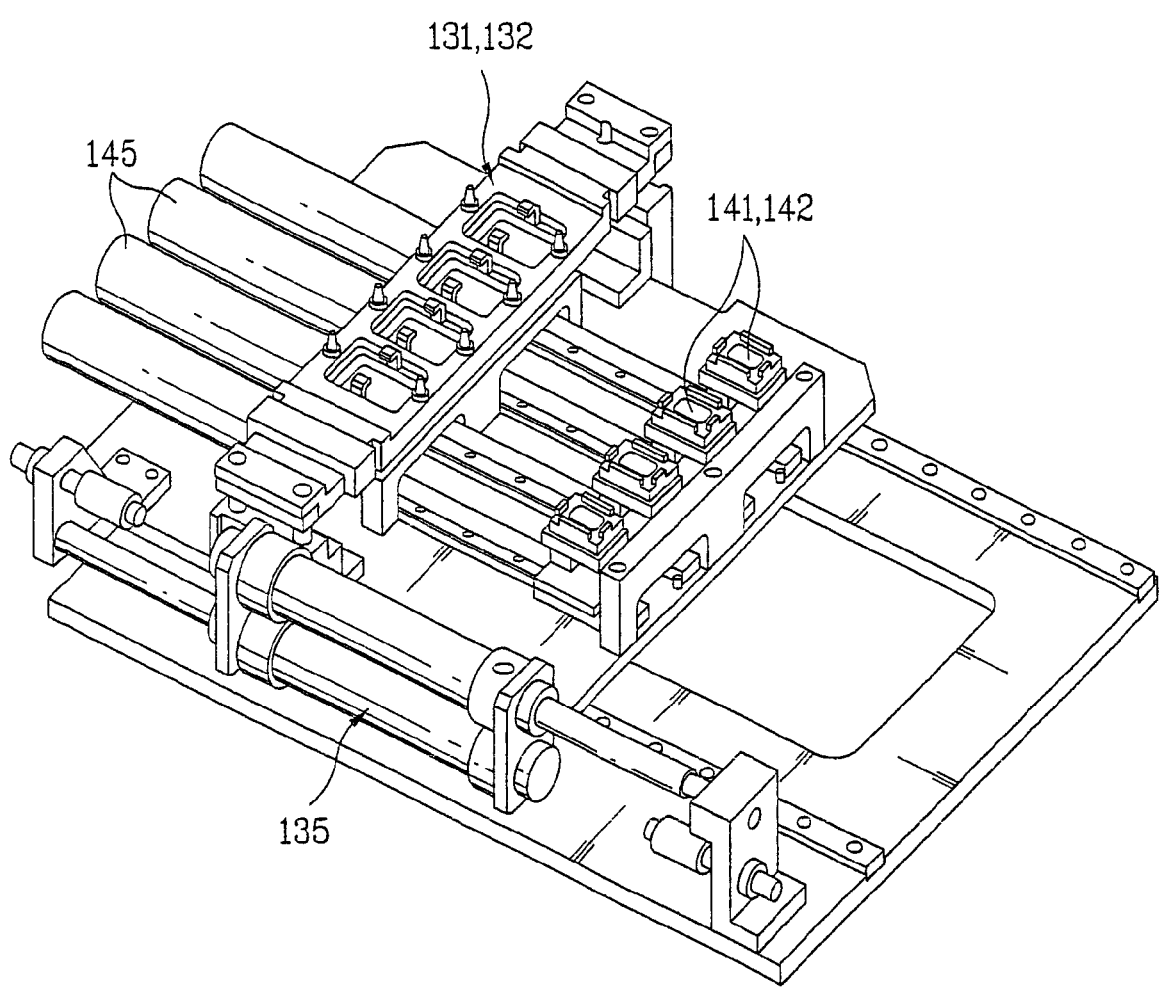
FIG. 3 illustrates a perspective view of the DC testing part and the unloading buffer of the sorting handler for a burn-in tester in FIG. 2.

Referring to FIGS. 2 and 3, the sorting handler for a burn-in tester includes a rack 200 on one side of a body 101 for loading a plurality of burn-in boards 'B', a first loader part 110 in one side part of the body 101 for transferring trays 'T' on a first loading stacker 111, having devices to be tested newly loaded thereon to backward in succession, and a first unloader part 115 arranged on a right a side of, and parallel to the first loader part 110 for transferring the tray from a tray stacker 117 in a rear part to a front part, and receiving, and loading good burn-in tested devices on a first unloading stacker 116 in the front part.

Opposite to the first loader part 110 and the first unloader part 115, there are a second loader part 120 for transferring the trays 'T' from a second loading stacker 121 to a rear part in succession, and a second unloader part 125 for transferring the trays from a tray stacker 127 in the rear part in succession, both of which have the same system with the first loader part 110 and the first unloader part 115, respectively.

Though not shown, the trays on the first, and second loader parts 110, and 120 and the first, and second unloader parts 115, and 125 can be moved linearly as much as desired to/from front/rear parts of the body 101 by using known linear moving systems, such as belt systems with timing belts, and guide devices, such as LM guides, appropriately.

In the meantime, there is a sorting part 150 in the front part of the body 101 for loading trays for receiving defective devices as results of burn-in test, and DC test.

There is an X-Y-θ table 105 under the body 101 for transferring the burn-in board 'B' from the rack 200 to a working position inside of the body 101, and transferring the burn-in board having a work thereon finished to an original position at the rack 200. In addition to the transferring of the burn-in boards, the X-Y-θ table 105 inverts a phase of the burn-in board to 0° and ±90° depending on a direction of the device at a working post in a central part of the body, and moves the burn-in board 'B' in an X-axis, or Y-axis direction by one step according to a sequence in device insertion or removal.

In the meantime, there are the working post WP in the central part of the body 101 for placing the burn-in board 'B' transferred from the rack 200 by the X-Y-θ table 105, and carrying out device inserting and removal, a first DC testing part 131 and a second DC testing part 132 on opposite sides of the working post WP for carrying out DC test of a device to be burn-in tested newly, and a first unloading buffer 141 and a second unloading buffer 142 in the vicinity of the first DC testing part 131 and the second DC testing part 132, respectively.

The first, and second DC testing parts 131, and 132, and the first, and second unloading buffers 141, and 142 are mounted on holders 130, and are shifted by main pneumatic cylinder 135 in a line with, and between a position of the working post WP, i.e., a position in a main working line, and a position in a sorting line SL where defective device sorting is carried out.

The first, and second unloading buffers 141, and 142 shift together between the main working line ML and the sorting line SL by the main pneumatic cylinders 135, and move individually from the main working line ML to the sorting line SL by preset distances by individual pneumatic cylinders 145 for transferring a buffer having defective device loaded thereon to the sorting line SL.

There is an X-axis main shaft 160 over the main working line ML across the first, and second DC testing parts 131, and 132, the working post WP, the first, and second loader parts 110, and 120, and the first, and second unloader parts 115, and 125.

There are a first loading/unloading picker 161 in one end part of the X-axis main shaft 160 for moving, and transferring devices between the first loader part 110 and the first unloader part 115, and the first DC testing part 131 linearly, and a second loading/unloading picker 164 in the other end part of the X-axis main shaft 160 for moving, and transferring devices between the second loader part 120 and the second unloader part 125, and the second DC testing part 132, linearly.

There are a first insert/remove picker 162, and a second insert/remove picker 163 between the first loading/unloading picker 161 and the second loading/unloading picker 164 for transferring devices between burn-in boards at the first, and second DC testing parts 131, and 132, or the first, and second unloading buffers 141, and 142 and the working post WP. Each of the first, and second insert/remove pickers 162, and 163 is connected to a slider 166 arranged to move along the X-axis main shaft 160, thereby making linear reciprocating movement following the movement of the slider 166.

There is a sorting picker 165 arranged over the sorting part 150 to move along sorting X-, and Y-axis shafts 170 for transferring defective devices from the first, and second DC testing parts 131, and 132, and the first, and second unloading buffers 141, and 142.

The first, and second loading/unloading pickers 161, and 164, the first, and second insert/remove pickers 162, and 163, and the sorting picker 165 move, not only horizontally, but also in up/down direction at respective designated positions, for picking up/releasing the devices.

Though not shown, as means for moving the first, and second loading/unloading pickers 161, and 164, the first, and second insert/remove pickers 162, and 163, and the sorting picker 165 a horizontal direction and up/down direction linearly, a variety of known linear motion mechanisms, such as a linear motion system with a linear motor, or a ball screw and servo motor, or a linear motion system with a belt or chain, or the like may be employed appropriately suitable to user requirements.

In the meantime, it is preferable that there are tray stackers 112, and 117, and a first tray transferor 181 in a rear part of the first loader part 110, and the first unloader part 115, for transferring empty trays from the tray stacker of the first loader part 110 to the tray stacker 117 of the first unloader part 115.

Identical to this, there may be tray stackers 122, and 127, and second tray transferor 182 in a rear part of the second loader part 120 and the second unloader part 125.

The operation of the sorting handler in a burn-in tester of the present invention will be described.

When a worker loads trays having devices to be burn-in tested newly thereon on the first loading stacker 111 of the first loader part 110, and the second loading stacker 121 of the second loader part 120, and loads cassette (not shown) having burn-in tested burn-in boards 'B' thereon on the rack 200, and putting the sorting handler into operation, the X-Y-θ table 105 moves toward the rack 200, draws one of the burn-in boards stacked on the rack 200, moves to the working post WP in the body 101, turns at 90° to change length/height directions of the burn-in board 'B', and stands by at a working post.

In this instance, right before the burn-in board 'B' is transferred to the working post in the body 101, a connection terminal C at one end of the burn-in board 'B' is connected to a connector (not shown) at the body 101, so that information on the burn-in board is given to a controlling unit (not shown) of the sorting handler, and test results of the devices on the burn-in board 'B' are shared through a network.

Then, the tray 'T' at the lowest position is separated from the first loading stacker 111, and transferred to the main working line ML, and the tray 'T' at the lowest position is separated from the second loading stacker 121, and transferred to the main working line ML, too.

In this instance, the trays on the tray stackers 117, and 127 in the rear parts of the first, and second unloader parts 115, and 125 are separated in succession starting from trays at the lowest positions, transferred to, and stand by at the main working line ML.

Moreover, the first, and second testing parts 131, and 132 are aligned with the main working line.

Once the trays on the first loader part 110 and the second loader part 120 are aligned with the main working line, the first loading/unloading picker 161 moves over the trays on the first loader part 110 on the right side when the drawing is seen from above, holds the devices, and moves to the left side when the drawing is seed from above again, places the devices on the first DC testing part 131, for progressing device DC test at the first DC testing part 131.

At the same time with this, the second loading/unloading picker 164 also moves to the second loader part 120, holds the devices, transfers the devices to the second DC testing part 132, for progressing device DC test. The main pneumatic cylinders 135 are come into operation as the DC test of the devices are finished at the second DC testing part 132, so that the second unloading buffer 142 are on standby in a state the second unloading buffer 142 is align with the main working line ML.

The slider 166 moves to right one the drawing when the drawing is seen from above if the DC test of the devices are finished at the first DC testing part 131, so that the second insert/remove picker 163 is positioned over the burn-in board 'B' at the working post WP, and the first insert/remove picker 162 is positioned over the first DC testing part 131.

Then, both the first, and second insert/remove pickers 162, and 163 move down at the same time, the first insert/remove picker 162 holds devices at the first DC testing part 131, to be tested newly, and the second insert/remove picker 163 holds the burn-in tested devices on the burn-in board 'B'.

Then, the first, and second insert/remove pickers 162, and 163 move to a left side of the drawing when the drawing is seen from above, together with the slider 166.

In the meantime, once the first, and second insert/remove pickers 162, and 163 move to the left side of the drawing, the first loading/unloading picker 161 moves to the first loader part 110 again, holds new devices, and moves to the first DC testing part 131 for carrying out DC testing.

While the first DC testing part 131 carries out the DC testing, the first unloading buffer 141 moves to the main working line ML, and stands by for receiving the device.

In the meantime, of the first, and second insert/remove pickers 162, and 163 moved to the left side of the drawing, the first insert/remove picker 162 is positioned over the burn-in board at the working post WP, and the second insert/remove picker 163 is positioned over the second unloading buffer 142.

Then, both the first, and second insert/remove pickers 162, and 163 move down at the same time, to load new devices on the burn-in board 'B', and tested devices on the second unloading buffer 142.

Thereafter, the second DC testing part 132 moves to the main working line ML again. At the same time with this, the burn-in board also moves by one step to expose the next tested device to the working post WP.

Once this operation is finished, the first, and second insert/remove pickers 162 and 163 move down at the same time, so that the second insert/remove picker 163 holds a new device on the second DC testing part 132, and the first insert/remove picker 162 holds the device on the burn-in board 'B' at the working post WP.

The first, and second insert/remove pickers 162, and 163 move up again, and move along the X-axis main shaft 160 to a right side of the drawing when the drawing is seen from above, so that the second inert/remove picker 163 inserts a new device in the burn-in board at the working post, and the first insert/remove picker 162 places tested device on the first unloading buffer 141.

Once the first, and second insert/remove pickers 162, and 163 move to the right side of the drawing, the second unloading buffer 142 moves to the main working line ML again, and the second loading/unloading picker 164 moves to the second unloading buffer 142, holds the tested device, moves to the second unloader part 125, and places good devices on the tray.

Then, the second loading/unloading picker 164 moves to the second loader part 120, and holds a new device, when the second DC testing part 132 moves to the main working line ML again, so that the second loading/unloading picker 164 transfers the new device to the second DC testing part 132, to carry out DC test. When the DC test is finished, the second unloading buffer 142 moves to the main working line ML, and stands by.

In the meantime, as described before, the first, and second insert/remove pickers 162, and 163 load the devices on the first unloading buffer 141, and the burn-in board 'B', and, the same as the process described before, the DC testing part 131 moves to the main working line ML, and the burn-in board 'B' moves by one step, under which state the first, and second insert/remove pickers 162, and 163 move down again, and hold new devices at the first DC testing part 131, and the tested devices on the burn-in board 'B' respectively, and move to the left side of the drawing, and load the devices on the burn-in board 'B', and the second unloading buffer 142, respectively.

Processes hereafter are the same with the foregoing processes, and the sorting handler of the present invention repeats the foregoing process continuously, to replace the devices.

In summary of the sorting process, the first, and second loading/unloading pickers 161, and 164 carries out processes according to a given sequence continuously, and repeatedly, in which the first, and second loading/unloading pickers 161, and 164 transfer new devices from the first, and second unloader parts 110, and 120, and transfer burn-in tested good devices from the first, and second unloading buffer 141, and 142 to the first, and second unloader parts 115, and 125, and places on the tray. In this instance, the first, and second DC testing parts 131, and 132 and the first, and second unloading buffers 141, and 142 move back and forth between the main working line ML, and the sorting line SL continuously, receive new devices and tested devices from the first, and second loading/unloading pickers 161, and 164 and the first, and second insert/remove pickers 162, and 163, and carry out DC test and stand by for device unloading, respectively.

The first insert/remove picker 162, and the second insert/remove picker 163 place devices on the first unloading buffer 141 and the burn-in board 'B' respectively, move up, and move down right away, holds devices at the first DC testing part 131 and the burn-in board 'B' respectively, move to the left side of the drawing, place the devices on the second unloading buffer 142 and the burn-in board 'B', move up, move down right away, hold the device at the second DC testing part 132 and the burn-in board 'B', move to the right side of the drawing which is an opposite side, and to carry out the foregoing processes repeatedly, and continuously.

Thus, because the first, and second insert/remove pickers 162, and 163 always hold devices picked up from opposite sides of the working post WP in a bi-directional movement along the X-axis main shaft 160, without having sections moving with empty handed, an overall working efficiency is improved.

In the meantime, if there is defective device found during the DC testing process, the main pneumatic cylinder 135 is operated, to move the first, or second DC testing part 132 to the sorting line SL, and the sorting picker 165 moves to the sorting line SL along the sorting X-, and Y-axis shafts 170, holds the defective device at the first DC testing part 131 or the second DC testing part 132, and places on the tray of the sorting part 150.

Then, the first, or second DC testing part 132 moves to the main working line again, the first or second loading/unloading picker 164 puts new devices in empty pockets of the first or second DC testing part 132, the DC test is carried out again to inspect for defect, and the process proceeds to the next step.

If defective devices are transferred from the burn-in board 'B' to the first, or second unloading buffer 141 or 142, the buffer having the defective device placed thereon is moved to the sorting line SL by the individual pneumatic cylinder 145.

Then, the sorting picker 165 moves to the sorting line SL along the sorting X-, and Y-axis shafts 170, holds the devices on the first, or second unloading buffer 141, or 142, moves along the sorting X-, and Y-axis shafts 170, and places the defective devices on a relevant tray 'T'.

During the device sorting is carried out at the burn-in board, the devices are unloaded from the first loader part 110 and the second loader part 120 entirely, and empty trays of the first loader part 110 and the second loader part 120 are transferred to rear most parts of the first and second loader parts 110 and 120, loaded on the tray stackers 112 and 122, temporarily, and, therefrom, transferred to the tray stackers 117 and 127 of the first and second unloader parts 115 and 125 by the first and second transferors 181, and 182.

Therefore, even if no additional trays are supplied to the first, and second unloader parts 115, and 125, the first, and second unloader parts 115, and 125 are still operative by using the trays from the first, and second loader parts 110, and 120.

The foregoing description on operation of the sorting handler is on a process for carrying out so called simultaneous INSERT & REMOVE in which the burn-in tested devices are removed from the burn-in board 'B' for sorting, and, at the same time with this, new devices are inserted to the burn-in board 'B'.

Other than the simultaneous insert & remove, when it is intended only to load new devices on the burn-in board 'B' 'INSERT ONLY', or only to unload burn-in tested devices from the burn-in board 'REMOVE ONLY', the device insert and remove can be carried out with a process simpler than the simultaneous INSERT & REMOVE.

For an example, if it is intended to carry out the 'INSERT ONLY', no trays are loaded on the first, and second unloader parts 115, and 125, but trays having new devices placed thereon are loaded only on the first, and second loader parts 110, and 120.

Then, upon putting the sorting handler into operation after loading empty burn-in boards without the devices on the rack 200, the X-Y-θ table 105 draws the burn-in board 'B' from the rack 200, transfers to the working post WP, turns the burn-in board 'B' at 90°, and stands by.

Since the first, and second unloading buffers 141, and 142 are not required when it is intended to carry out the INSERT ONLY, the first, and second DC testing parts 131, and 132 are fixed at the main working line ML, a position of the first, and second DC testing parts 131, and 132 at an initial starting of the sorting handler, until the INSERT ONLY is finished.

If the trays are transferred from the first, and second loader parts 110 and 120 to the main working line ML starting from the tray 'T' at the lowest position in succession, the first, and second unloading pickers 161, and 164 pick up, and hold new devices from the first, and second loader parts 110, and 120 at opposite ends of the main working line ML, transfer to, and load on the first, and second DC testing parts 131, and 132, to carry out DC test of the devices.

In this instance, the first, and second loading/unloading pickers 161, and 164 move to the first, and second loader parts 110, and 120 at opposite sides of the body 101 again, hold devices, and stand by.

If the DC test is finished at the first, and second DC testing parts 131, and 132, the first, and second insert/remove pickers 162, and 163 move to the right side of the drawing, and the first insert/remove picker 162 holds the devices on the first DC testing part 131.

Then, the first, and second insert/remove pickers 162, and 163 move to the left side of the drawing again, and loads the devices on the burn-in board 'B', and, at the same time with this, the second insert/remove picker 163 holds the devices on the second DC testing part 132.

Then, the first, and second insert/remove pickers 162, and 163 move to the right side of the drawing, the second insert/remove picker 163 loads the devices on the burn-in board 'B', and, at the same time with this, the first insert/remove picker 162 holds the devices on the first DC test part 131.

Thus, when the INSERT ONLY is carried out, the first, and second insert/remove pickers 162, and 163 supply devices to the first, and second DC parts 131, and 132 continuously, and the first, and second insert/remove pickers 162, and 163 only carry out a work repeatedly, and continuously, in which the devices supplied to the first, and second DC testing parts 131, and 132 are loaded on the burn-in board 'B' while moving in both directions.

In the meantime, also when the REMOVE ONLY is carried out, in which only tested devices are removed from the burn-in board 'B', the REMOVE ONLY can be carried out in a process similar to above.

In this case, the first, and second DC testing parts 131 and 132 are not positioned not at the main working line, but the first, and second unloading buffers 141, and 142 are fixed to and use at the main working line ML, the first, and second insert/remove pickers 162, and 163 move in both directions, and transfer tested devices from the burn-in board 'B' to the first, and second unloading buffers 141, and 142 on both sides of the burn-in board 'B', and the first, and second loading/unloading pickers 161, and 164 transfer the devices on the first, and second unloading buffers 141, and 142 to the trays on the first, and second unloader parts 115, and 125, and load thereon.

In the meantime, even though the foregoing embodiment of the sorting handler for a burn-in tester suggests that, if the defective device is found at the DC testing part, the entire DC testing part moves to the sorting line, removes only the defective device, and insert a new device only in the space, for carrying out the DC test again, different from this, it may be possible that a DC buffer part may be arranged on one side of each of the first, and second DC testing parts 131, and 132 additionally, so that, if there is a defective device found at the DC testing parts, the defective device is removed from the DC testing part, and transferred to the sorting part, good devices are loaded on the buffer parts temporarily, for transferring the good devices to the burn-in board, separately.

As has been described, because the two insert/remove pickers, which is to remove, and transfer tested devices from the burn-in board, and hold, and transfer new devices from the DC testing part or the buffer, can hold, and transfer devices whenever the two insert/remove pickers move in both directions of the body, a rate of sorting can be improved, significantly.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A sorting handler for handling electronic devices, comprising:
    at least one loader configured to interface with a stacker that holds trays bearing electronic devices;
    at least one unloader configured to interface with a stacker that holds trays bearing electronic devices;
    a table configured to carry and position a rack for receiving the electronic devices at a central area of the sorter handler;
    a holder configured to receive, temporarily hold and release electronic devices that are traveling in a first direction from the at least one loader to the rack, and that is also configured to receive, temporarily hold and release electronic components that are traveling in a second opposite direction from the rack to the at least one unloader; and
    at least one loading/unloading picker configured to transport the electronic devices between the loader, the holder and the rack.

2. The sorting handler of claim 1, wherein the holder comprises at least one testing part, and at least one buffer part, for the electronic devices.

3. The sorting handler of claim 2, wherein the at least one testing part receives, temporarily holds, and releases the electronic devices that are being transported in one of the first and second travel directions, and wherein the at least one buffer part receives, temporarily holds, and releases electronic devices that are traveling in the other of the first and second travel directions.

4. A sorting handler for handling electronic devices, comprising:
    at least one loader configured to interface with a stacker that holds trays bearing electronic devices;
    at least one unloader configured to interface with a stacker that holds trays bearing electronic devices;
    a table configured to carry and position a rack for receiving the electronic devices at a central area of the sorter handler;
    a holder configured to receive, temporarily hold and release electronic devices that are traveling in a first direction from the at least one loader to the rack, and that is also configured to receive, temporarily hold and release electronic components that are traveling in a second opposite direction from the rack to the at least one unloader, wherein the holder comprises:
        at least one testing part that receives, temporarily holds, and releases the electronic devices that are being transported in one of the first and second travel directions;
        at least one buffer part that receives, temporarily holds, and releases electronic devices that are traveling in the other of the first and second travel directions; and
        a shifter that is configured to alternately align the at least one testing part and the at least one buffer part with a main line, along which at least one loading/unloading picker moves, wherein the at least one loading/unloading picker is configured to transport the electronic devices between the loader, the holder and the rack.

5. The sorting handler of claim 4, wherein the holder further comprises a second shifter configured to align the at least one buffer part with a sorting line.

6. The sorting handler of claim 5, wherein the at least one buffer part comprises a plurality of buffers, each buffer being configured to hold at least one of the electronic devices, and wherein the second shifter comprises a plurality of actuators, wherein each actuator is configured to align a corresponding buffer with the sorting line.

7. The sorting handler of claim 4, further comprising a sorting picker which moves along the sorting line, wherein the sorting picker is configured to transport electronic devices between the at least one buffer of the holder, and a plurality of sorting trays.

8. The sorting handler of claim 1, wherein the at least one loading/unloading picker is also configured to transport electronic devices to the unloader.

9. The sorting handler of claim 8, wherein the at least one loader comprises first and second loaders, wherein the at least one unloader comprises first and second unloaders, and wherein the at least one loading/unloading picker comprises first and second loading/unloading pickers.

10. A sorting handler for handling electronic devices, comprising:
    first and second loaders each configured to interface with a stacker that holds trays bearing electronic devices;
    first and second unloaders each configured to interface with a stacker that holds trays bearing electronic devices;
    a table configured to carry and position a rack for receiving the electronic devices at a central area of the sorter handler;

a holder configured to receive, temporarily hold and release electronic devices that are traveling in a first direction from the at least one loader to the rack, and that is also configured to receive, temporarily hold and release electronic components that are traveling in a second opposite direction from the rack to the at least one unloader; and first and second loading/unloading pickers each configured to transport the electronic devices between the loader, the holder and the rack, and to transport electronic devices to the unloader, wherein the first loader and the first unloader are located on a first side of the central area where the rack is positioned, and wherein the second loader and the second unloader are located on a second opposite side of the central area.

11. The sorting handler of claim 10, wherein the holder comprises first and second holders.

12. The sorting handler of claim 11, wherein the first holder is located on the first side of the central area, and wherein the second holder is located on the second side of the central loading area.

* * * * *